(12) United States Patent
Yoshitomi et al.

(10) Patent No.: US 6,617,666 B2
(45) Date of Patent: Sep. 9, 2003

(54) SEMICONDUCTOR DEVICE WITH CAPACITOR AND PROCESS FOR MANUFACTURING THE DEVICE

(75) Inventors: Takashi Yoshitomi, Kamakura (JP); Yuichi Nakashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/093,114

(22) Filed: Mar. 7, 2002

(65) Prior Publication Data

US 2002/0127792 A1 Sep. 12, 2002

(30) Foreign Application Priority Data

Mar. 8, 2001 (JP) .................................... 2001-065253

(51) Int. Cl.[7] .............................................. H01L 29/00
(52) U.S. Cl. ...................... 257/535; 257/532; 257/506; 257/508; 257/524; 438/957
(58) Field of Search ................................ 257/506, 508, 257/524, 532, 535; 438/207, 218, 219, 294, 427, 348, 361, 295, 355, 404, 957

(56) References Cited

U.S. PATENT DOCUMENTS 6,226,171 B1 * 5/2001 Beilin et al. ............. 361/306.3

FOREIGN PATENT DOCUMENTS

JP 10-41481 2/1998

* cited by examiner

*Primary Examiner*—Nathan J. Flynn
*Assistant Examiner*—Scott R. Wilson
(74) *Attorney, Agent, or Firm*—Frommer Lawrence & Haug LLP; Grace L. Pan (57) ABSTRACT

A semiconductor device includes a first insulating film comprising an opening, a capacitor formed at a selected position in the opening, a second insulating film formed at least in the opening, and a third insulating film formed on the second insulating film.

13 Claims, 9 Drawing Sheets

SEMICONDUCTOR DEVICE WITH CAPACITOR AND PROCESS FOR MANUFACTURING THE DEVICE

CROSS-REFERENCE TO RELATED APPLICATIONS

This application is based upon and claims the benefit of priority from prior Japanese Patent Application No. 2001-065253, filed Mar. 8, 2001, the entire contents of which are incorporated by reference.

BACKGROUND OF THE INVENTION

1. Field of the Invention

The present invention relates to a semiconductor device with an MIM (Metal Insulating Metal) capacitor, and a process for manufacturing the semiconductor device.

2. Description of the Related Art

Semiconductor devices provided with Cu wiring of a damascene structure and MIM capacitors are now available.

Figure 28:
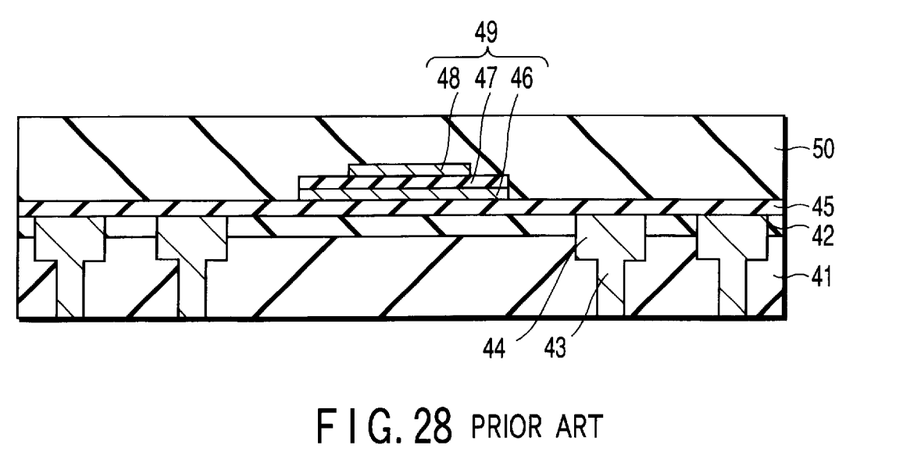
FIG. 28 is a sectional view illustrating a conventional semiconductor device.

FIG. 28 is a sectional view of a conventional semiconductor device. As shown in FIG. 28, a via hole 43 and a wire 44, which are made of, for example, Cu, are provided in a film 41 of a low dielectric constant and a film 42 of a high dielectric constant. A Cu-diffusion-preventing film 45 is provided on the high dielectric film 42 and wire 44, and a capacitor 49 is provided on a selected portion of the Cu-diffusion-preventing film 45. The capacitor 49 is formed of a lower electrode 46, a dielectric film 47 and an upper electrode 48. An insulating film 50 is provided on the capacitor 49 and Cu-diffusion-preventing film 45. The surface of the insulating film is flattened by CMP (Chemical Mechanical Polishing).

In such conventional semiconductor devices, it is desirable that the insulating film 50 be formed of a low dielectric film in order to reduce the parasitic capacitance between wires.

However, since the low dielectric film is a rough film, a crack may occur if the surface of the film is flattened. Therefore, it is very difficult to level, by CMP, the surface of an insulating film 50 formed of a low dielectric film. To avoid this, a high dielectric film could be used as the insulating film 50, as thus would reduce the formation of cracks under CMP.

However, since the capacitor 49 is provided on a selected portion of the Cu-diffusion-preventing film 45, there is a step corresponding to the thickness of the capacitor 49 between the area provided with the capacitor and the area without. To eliminate the step caused by the presence of the capacitor 49, it is necessary to form an insulating film 50 in the area with no capacitor on the Cu-diffusion-preventing film 45. Thus, as stated above, a high dielectric film or insulating film 50 is provided on the film 45 to surround the capacitor 49. The provision of the high dielectric insulating film 50 to fill the step caused by the capacitor 49 inevitably increases the parasitic capacitance between wiring layers.

As described above, in the conventional semiconductor device, it is very difficult to level the surface of the insulating film 50 by CMP.

BRIEF SUMMARY OF THE INVENTION

According to a first aspect of the present invention, there is provided a semiconductor device comprising: a first insulating film comprising an opening; a capacitor formed at a selected position in the opening; a second insulating film formed at least in the opening; and a third insulating film formed on the second insulating film.

According to a second aspect of the present invention, there is provide a process of manufacturing a semiconductor device, comprising: forming a first insulating film; removing a selected portion of the first insulating film, thereby forming an opening; forming a capacitor at a selected position in the opening; forming a second insulating film at least in the opening; and forming a third insulating film on the second insulating film.

DETAILED DESCRIPTION OF THE INVENTION

Reference will now be made in detail to the presently embodiments of the invention as illustrated in the accompanying drawings, in which like reference characters designate like or corresponding parts in all drawings.

In the embodiments of the invention, a "low dielectric film" means a film having a relative dielectric constant of about 4.0 or more, while a "high dielectric film" means a film having a higher relative dielectric constant than a low dielectric film.

First Embodiment

In a first embodiment of the invention, an opening is provided in an insulating film, i.e., a low dielectric film, and an MIM (Metal Insulating Metal) capacitor is formed in the opening.

FIGS. 1–9 are sectional views illustrating the steps of a process for manufacturing a semiconductor device according to the first embodiment. A description will now be given of the process for manufacturing the semiconductor device according to the first embodiment.

Figure 1:
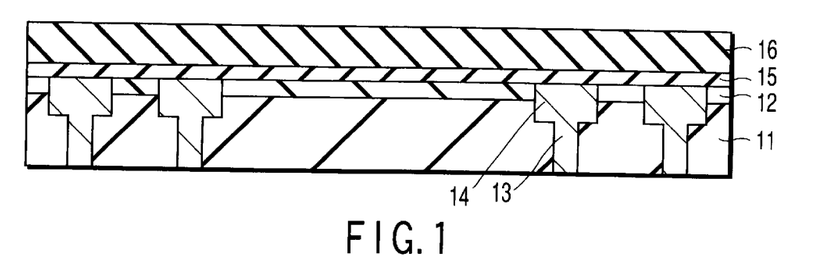
FIGS. 1, 2, 3, 4, 5, 6, 7, 8 and 9 are sectional views illustrating the steps of a process for manufacturing a semiconductor device according to a first embodiment of the invention.

Firstly, as shown in FIG. 1, a high dielectric film 12 having a higher relative dielectric constant than a low dielectric film 11 is formed on the low dielectric film 11. Subsequently, using a damascene process, a via hole 13 and a first wire 14, which are made of, for example, Cu, are formed in the low and high dielectric films 11 and 12. Thereafter, a Cu-diffusion-preventing film 15 made of, for example, SiN is formed on the first wire 14 and high dielectric film 12 by sputtering. An insulating film 16 as a low dielectric film is formed on the Cu-diffusion-preventing film 15. The thickness of the insulating film 16 is formed to, for example, 270 nm.

Figure 2:
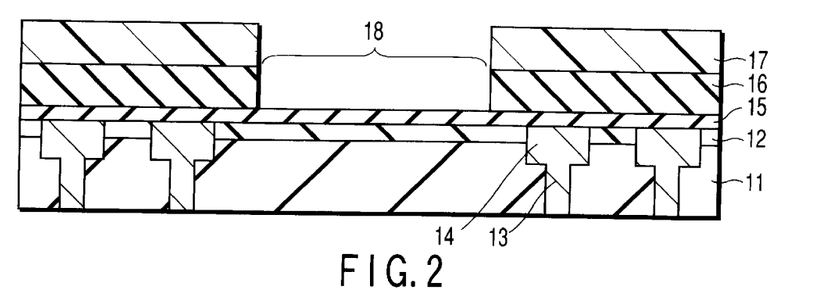

Referring to FIG. 2, the insulating film 16 is coated with a resist film 17, which is patterned by lithography. Using the patterned resist film 17 as a mask, the insulating film 16 is patterned by RIE (Reactive Ion Etching), thereby forming an opening 18. Then, the resist film 17 is removed.

Figure 3:
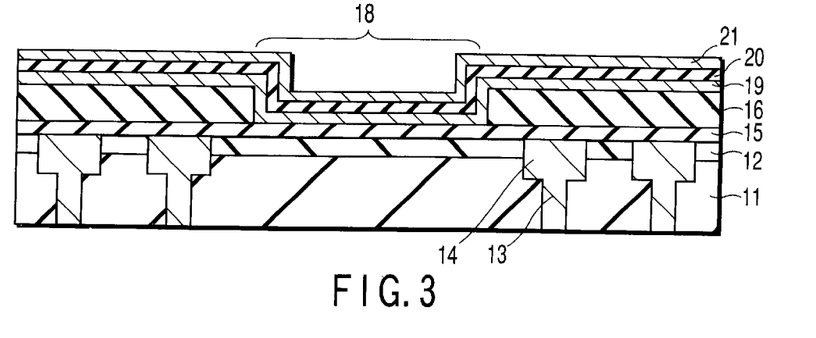

Referring to FIG. 3, a lower electrode film 19 made of, for example, TiN is formed in the opening 18 and on the insulating film 16 by sputtering, and a dielectric film 20 made of, for example, $Ta_2O_2$ is formed on the lower electrode film 19. Further, an upper electrode film 21 made of, for example, TiN is formed on the dielectric film 20. The thicknesses of the lower electrode film 19, dielectric film 20 and upper electrode film 21 are formed to, for example, 60 nm, 50 nm and 50 nm, respectively.

Figure 4:
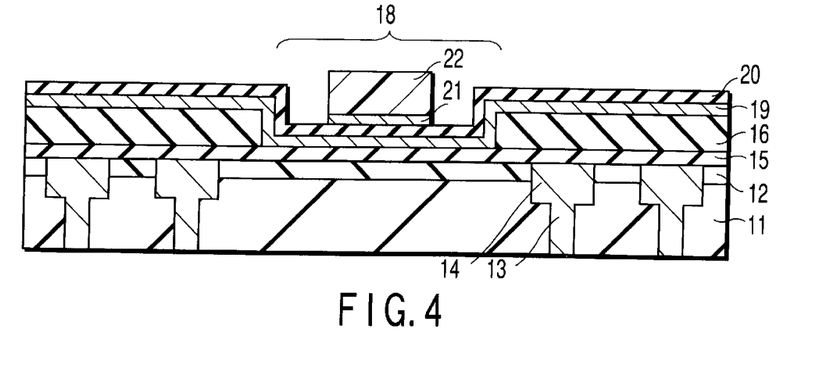

Referring to FIG. 4, the upper electrode film 21 is coated with a resist film 22, which is patterned by lithography. After that, using the patterned resist film 22 as a mask, the upper electrode film 21 is patterned by RIE such that it remains in the opening 18. Then, the resist film 22 is removed.

Figure 5:
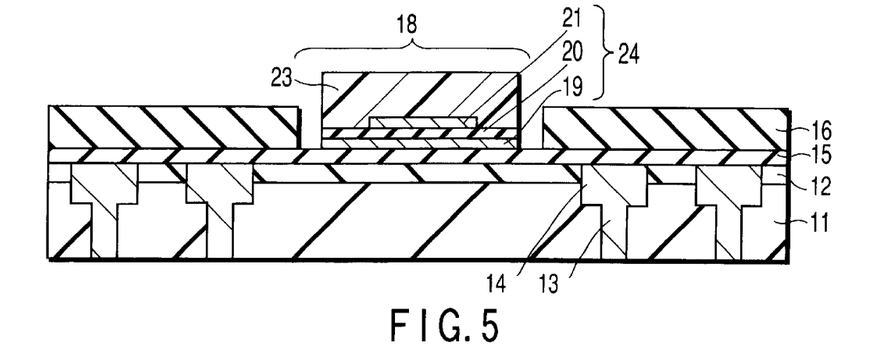

Referring to FIG. 5, the upper electrode film 21 and dielectric film 20 are coated with a resist film 23, which is patterned by lithography. After that, using the patterned resist film 23 as a mask, the dielectric film 20 and lower electrode film 19 are patterned by RIE such that they have surface areas larger than that of the upper electrode film 21, and remain in the opening 18. As a result, an MIM capacitor 24, composed of the lower electrode film 19, dielectric film 20 and upper electrode film 21, is formed in the opening 18. Then, the resist film 23 is removed.

Figure 6:
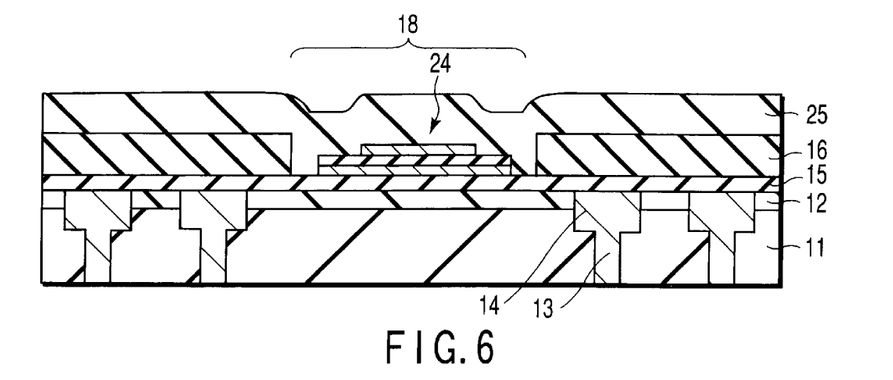

Referring to FIG. 6, a first interlayer film 25 is formed in the opening 18 and on the insulating film 16 by PECVD (Plasma Enhanced Chemical Vapor Deposition). The first interlayer film 25 is a high dielectric film form of $SiO_2$, for example. However, the film 25 is not limited to a high dielectric film, as long as it is an insulating film that is formed at a low temperature and can be subjected to CMP.

Figure 7:
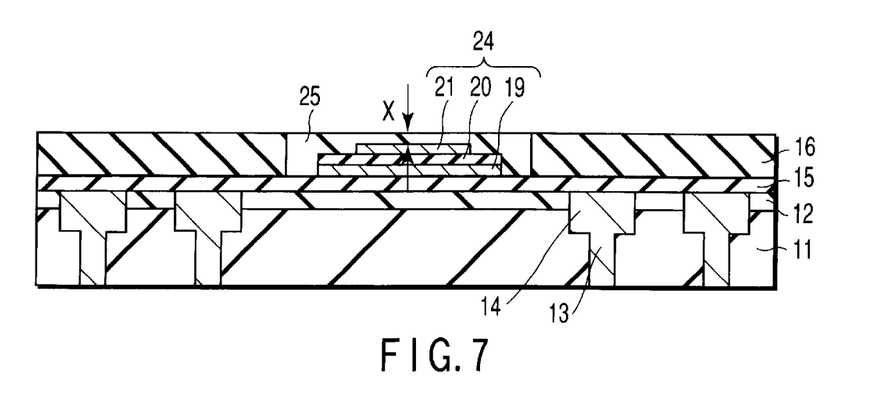

Referring to FIG. 7, the first interlayer film 25 is flattened by CMP (Chemical Mechanical Polishing) until the surface of the insulating film 16 is exposed. At this time, it is desirable that a marginal interlayer portion X of about 500 Å to 1000 Å be left on the capacitor 24 so that the surface of the capacitor 24 will not be exposed. In other words, it is sufficient if the capacitor 24, composed of the lower electrode film 19, dielectric film 20 and upper electrode film 21, is made thinner than the insulating film 16.

Figure 8:
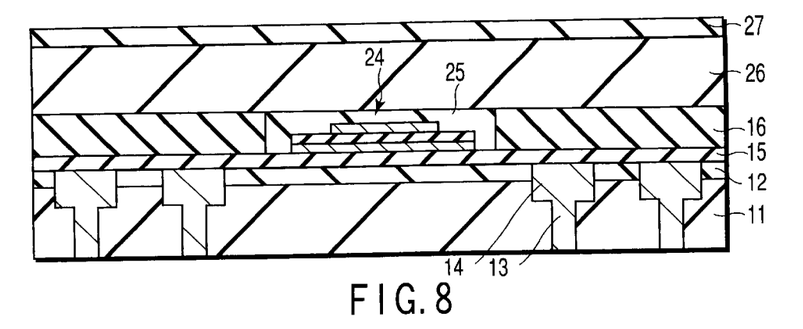

Referring to FIG. 8, a second interlayer film 26 is formed on the first interlayer film 25 and insulating film 16, and a third interlayer film 27 is formed on the second interlayer film 26. The second interlayer film 26 is a low dielectric film such as an FSC (fluorine Spin Glass) film, while the third interlayer film 27 is a high dielectric film, formed of $SiO_2$, for example.

Figure 9:
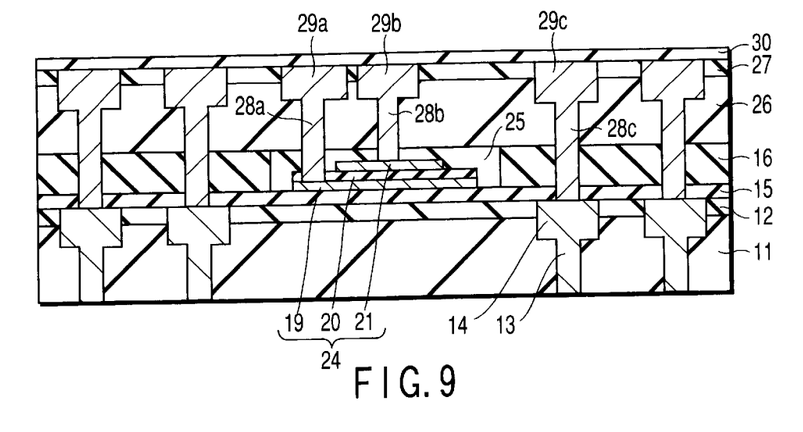

Referring to FIG. 9, the first, second and third interlayer films 25, 26 and 27, etc. are removed to form via holes and grooves for wires. Thereafter, a barrier metal layer (not shown) is deposited in via holes and wire grooves, and is plated with a Cu film. The barrier metal layer and Cu film are flattened by CMP, thereby forming via holes 28a, 28b and 28c and second wires 29a, 29b and 29c. The via hole 28a and second wire 29a are connected to the lower electrode film 19 on the capacitor 24, the via hole 28b and second wire 29b are connected to the upper electrode film 21 on the capacitor 24, while the via hole 28c and second wire 29c are connected to the first wire 14. Subsequently, a Cu-diffusion-preventing film 30 is formed on the third interlayer film 27 and second wires 29a, 29b and 29c.

Figure 10:
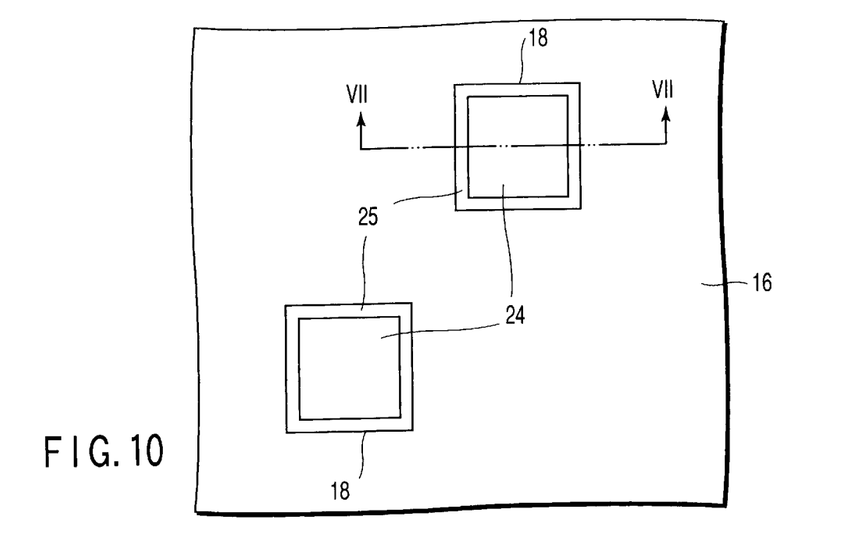
FIG. 10 is a plan view illustrating the semiconductor device according to the first embodiment of the invention.

FIG. 10 is a plan view illustrating the semiconductor device according to the first embodiment of the invention. As shown in FIG. 10, the opening 18 is formed in the insulating film 16, and the capacitor 24 is formed in the opening 18. As a result, the capacitor 24 is surrounded by the insulating film 16, and the first interlayer film 25 is formed in a clearance in the opening 18. FIG. 7 is a sectional view taken along line VII—VII of FIG. 10.

In the above-described first embodiment, the first interlayer film 25 on the capacitor 24 is a film (e.g. a high dielectric film) that does not easily crack even if it is subjected to CMP. Accordingly, the surface of the first interlayer film 25 on the capacitor 24 can be flattened by CMP.

Further, since the opening 18 is formed in the insulating film 16 and receives the capacitor 24, the insulating film 16 surrounds the capacitor 24. Thus, the first interlayer film 25 as a high dielectric film is provided only in the opening 18, which further reduces the parasitic capacitance between the wires.

Also, the second interlayer film 26 as a low dielectric film is mostly formed around the via holes 28a, 28b and 28c and second wires 29a, 29b and 29c, the parasitic capacitance between the wires can be further reduced.

Furthermore, the provision of the insulating film 16 around the capacitor 24 enables the step due to the capacitor 24 to be reduced. In other words, when the first interlayer film 25 is formed on the capacitor 24, the shape of the capacitor 24 does not significantly influence the first interlayer film 25. Accordingly, the surface of the first interlayer film 25 on the capacitor 24 can be more easily flattened than in the conventional case.

Also, since the insulating film 16 is a low dielectric film, the parasitic capacitance between the wires can be further reduced.

Moreover, the Cu-diffusion-preventing film 15 provided under the capacitor 24 prevents Cu from diffusing from the second wires 29a, 29b and 29c and via holes 28a, 28b and 28c into an element (not shown) located below and contaminating it.

Further, the margin X prepared for flattening the first interlayer film 25 by CMP prevents the surface of the capacitor 24 from being damaged, thereby enhancing the performance of the capacitor 24.

The first interlayer film 25 may be an organic insulating film formed by coating. In this case, the surface of the organic insulating film can be substantially flattened when it is coated, and therefore, the leveling process using CMP shown in FIG. 7 can be omitted. This means that a low dielectric film can be used as the first interlayer film 25, which cannot be realized in light of the process of CMP in the prior art. Thus, the use of a coating-type film as the first interlayer film 25 can reduce the capacitance between the wires, as well as the number of required process steps.

In addition, if the surface of the first interlayer film 25 is sufficiently flattened by CMP in the process of FIG. 7, it is not necessary to level the first interlayer film 25 until the surface of the insulating film 16 is exposed. However, the thinner the remaining portion of the first interlayer film 25 as a high dielectric film, the lower the capacitance between the wires. In light of this, it is desirable to level the first interlayer film 25 until the surface of the insulating film 16 is exposed.

Figure 11:
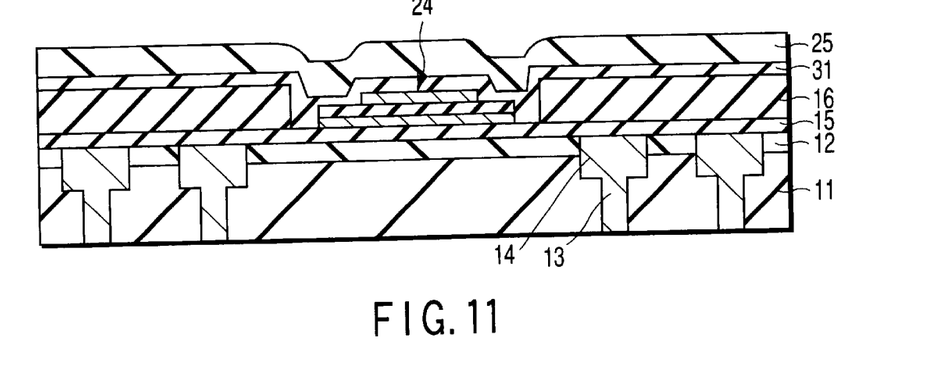
FIGS. 11, 12 and 13 are sectional views illustrating the steps of a process for manufacturing another semiconductor device according to the first embodiment of the invention.
Figure 12:
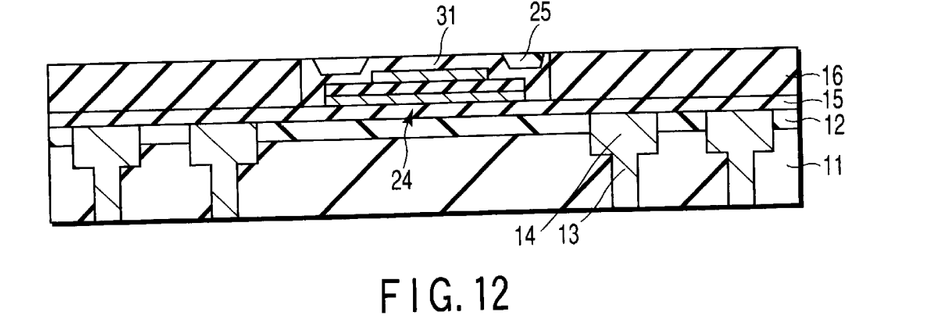
Figure 13:
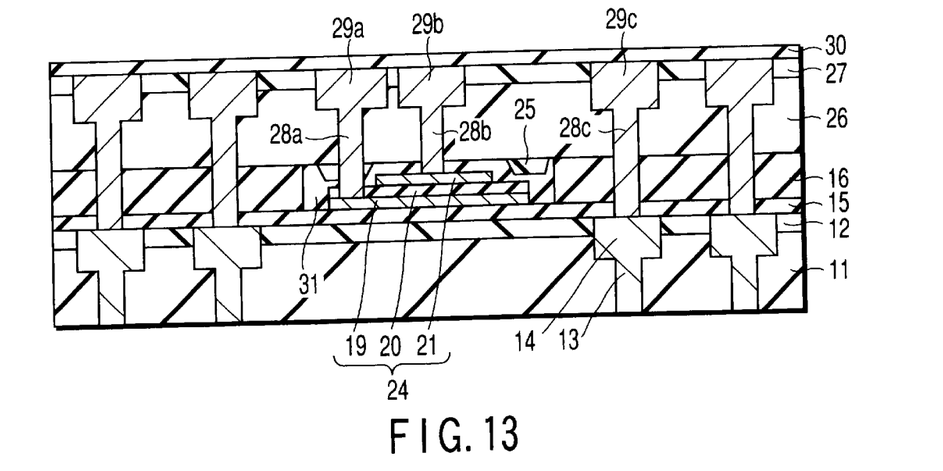

In the first embodiment, another Cu-diffusion-preventing film may be formed on the capacitor 24 to protect it. In this case, at first, the capacitor 24 is formed as shown in FIG. 5. Subsequently, a Cu-diffusion-preventing film 31 is formed on the capacitor 24 and insulating film 16, and the first interlayer film 25 is formed on the Cu-diffusion-preventing film 31, as is shown in FIG. 11. Then, the first interlayer film 25 is flattened by CMP until the surface of the insulating film 16 is exposed, as is shown in FIG. 12. After that, the structure as shown in FIG. 13 is formed by process steps similar to those of the first embodiment. In this structure, the Cu-diffusion-preventing film 31 on the capacitor 24 prevents Cu from diffusing from the second wires 29*a*, 29*b* and 29*c* and via holes 28*a*, 28*b* and 28*c* into the dielectric film 20 of the capacitor 24 and contaminating it.

Second Embodiment

In a second embodiment, the insulating film having the opening is a Cu-diffusion-preventing film.

FIGS. 14 to 22 are sectional views illustrating a process for manufacturing a semiconductor device according to the second embodiment. The process of manufacturing the semiconductor device of the second embodiment will be described. In this process, only steps differing from those of the first embodiment will be described.

Figure 14:
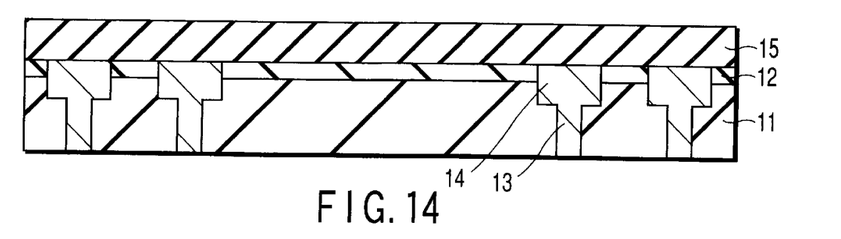
FIGS. 14, 15, 16, 17, 18, 19, 20, 21 and 22 are sectional views illustrating the steps of a process for manufacturing a semiconductor device according to a second embodiment of the invention.

Referring first to FIG. 14, a via hole 13 and a first wire 14, which are made of, for example, Cu, are formed in low and high dielectric films 11 and 12, as in the first embodiment. Thereafter, a Cu-diffusion-preventing film 15 made of, for example, SiN is formed on the first wire 14 and high dielectric film 12 by sputtering. The thickness of the Cu-diffusion-preventing film 15 is formed to, for example, 270 nm.

Figure 15:
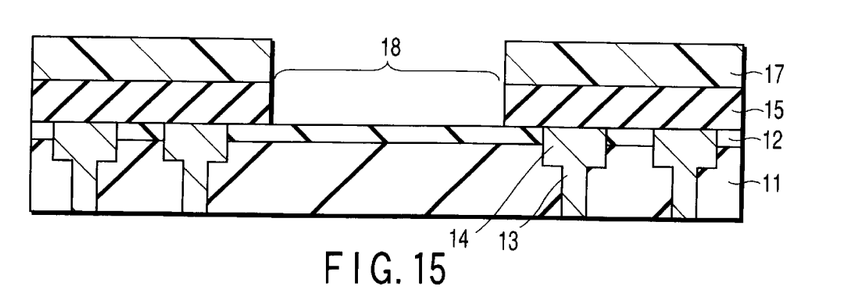

Referring to FIG. 15, the Cu-diffusion-preventing film 15 is coated with a resist film 17, which is patterned by lithography. Using the patterned resist film 17 as a mask, the Cu-diffusion-preventing film 15 is patterned by RIE, thereby forming an opening 18. Then, the resist film 17 is removed.

Figure 16:
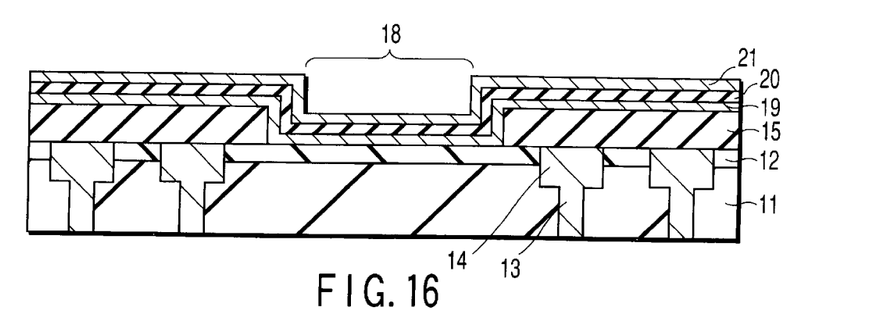

Referring to FIG. 16, a lower electrode film 19 made of, for example, TiN is formed in the opening 18 and on the Cu-diffusion-preventing film 15 by sputtering, and a dielectric film 20 made of, for example, $Ta_2O_2$ is formed on the lower electrode film 19. Further, an upper electrode film 21 made of, for example, TiN is formed on the dielectric film 20. The thicknesses of the lower electrode film 19, dielectric film 20 and upper electrode film 21 are set to, for example, 60 nm, 50 nm and 50 nm, respectively.

Figure 17:
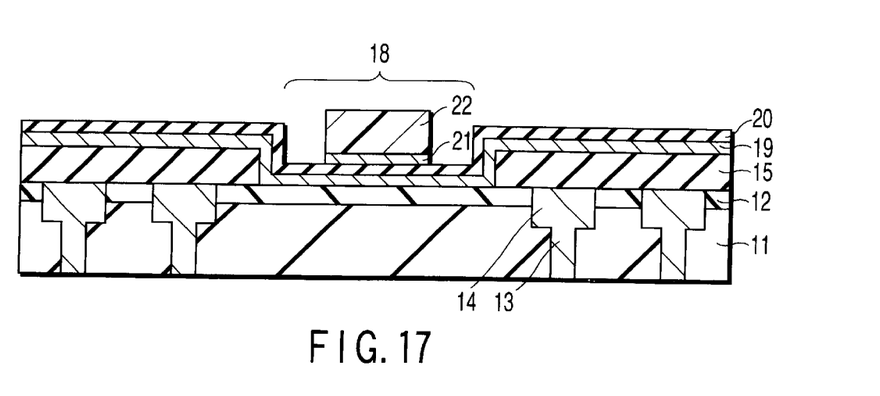

Referring to FIG. 17, the upper electrode film 21 is coated with a resist film 22, which is patterned by lithography. After that, using the patterned resist film 22 as a mask, the upper electrode film 21 is patterned by RIE such that it remains in the opening 18. Then, the resist film 22 is removed.

Figure 18:
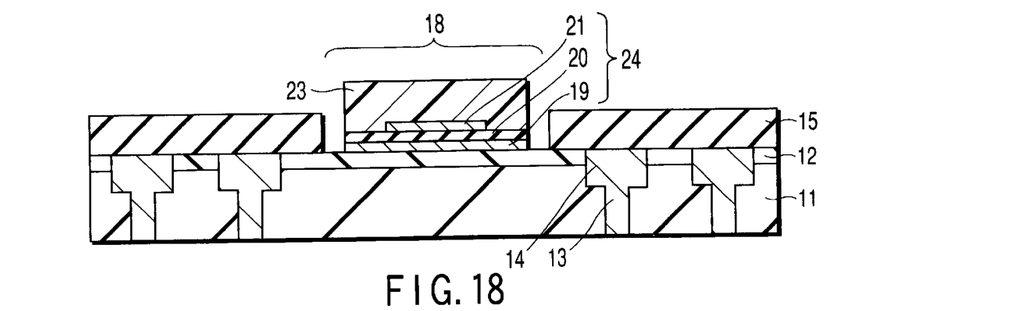

Referring to FIG. 18, the upper electrode film 21 and dielectric film 20 are coated with a resist film 23, which is patterned by lithography. After that, using the patterned resist film 23 as a mask, the dielectric film 20 and lower electrode film 19 are patterned by RIE such that they have surface areas larger than that of the upper electrode film 21 and remain in the opening 18. As a result, an MIM capacitor 24, composed of the lower electrode film 19, dielectric film 20 and upper electrode film 21, is formed in the opening 18. Then, the resist film 23 is removed.

Figure 19:
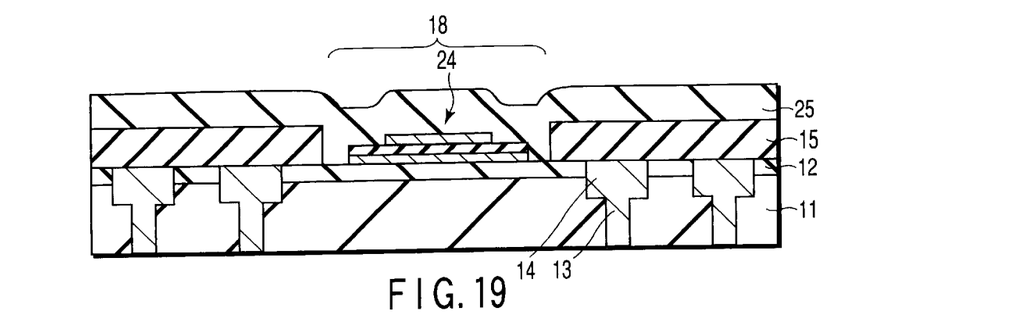

Referring to FIG. 19, a first interlayer film 25 is formed in the opening 18 and on the Cu-diffusion-preventing film 15 by PECVD. The first interlayer film 25 is a high dielectric film formed of $SiO_2$, for example. However, the film 25 is not limited to a high dielectric film, as long as it is an insulating film that is formed at a low temperature and can be subjected to CMP.

Figure 20:
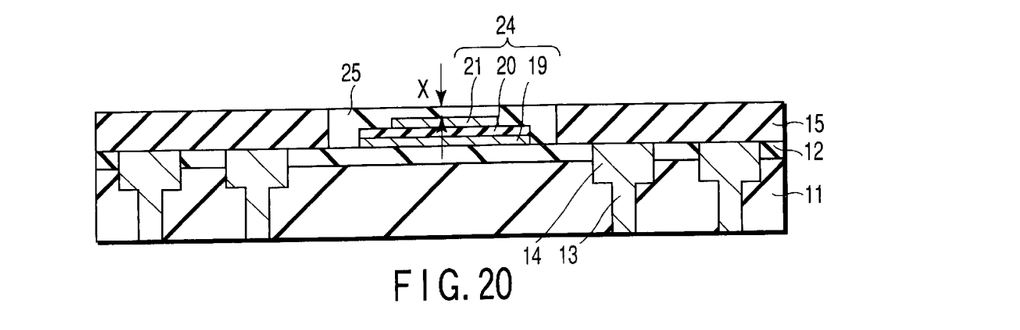

Referring to FIG. 20, the first interlayer film 25 is flattened by CMP until the surface of the Cu-diffusion-preventing film 15 is exposed. At this time, it is desirable that a marginal interlayer portion X of about 500 Å to 1000 Å be left on the capacitor 24 so that the surface of the capacitor 24 will not be exposed. In other words, it is sufficient if the capacitor 24, composed of the lower electrode film 19, dielectric film 20 and upper electrode film 21, is made thinner than the Cu-diffusion-preventing film 15.

Figure 21:
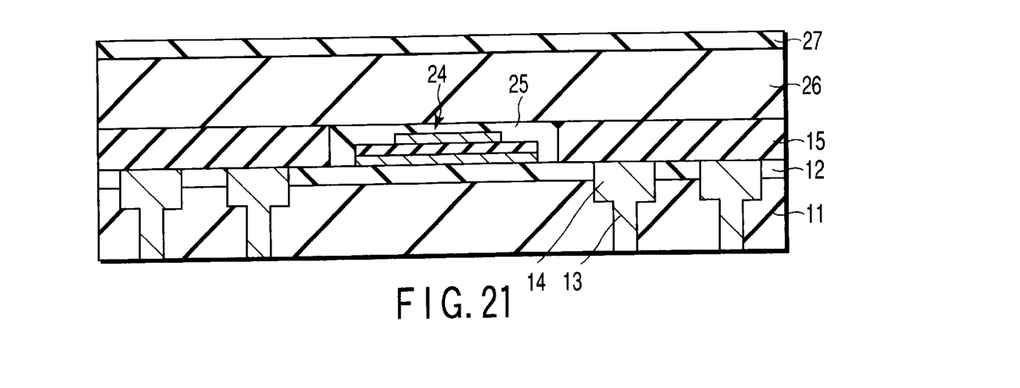

Referring to FIG. 21, a second interlayer film 26 is formed on the first interlayer film 25 and Cu-diffusion-preventing film 15, and a third interlayer film 27 is formed on the second interlayer film 26. The second interlayer film 26 is a low dielectric film such as an FSC film, while the third interlayer film 27 is a high dielectric film formed of $SiO_2$, for example.

Figure 22:
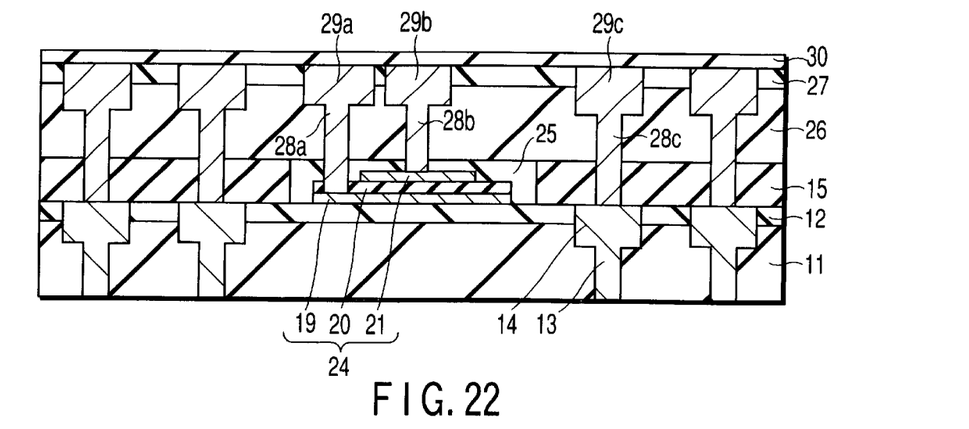

Referring to FIG. 22, via holes 28*a*, 28*b* and 28*c* and second wires 29*a*, 29*b* and 29*c* are formed, and then a Cu-diffusion-preventing film 30 is formed, as in the first embodiment.

The above-described second embodiment can provide the same advantages as the first embodiment.

Further, in the second embodiment, the opening 18 is formed in the Cu-diffusion-preventing film 15. In other words, the Cu-diffusion-preventing film 15 is used instead of providing a film dedicated to the formation of the opening 18 therein (which corresponds to the insulating film 16 in the first embodiment). Accordingly, the second embodiment requires a smaller number of process steps than the first embodiment.

Figure 23:
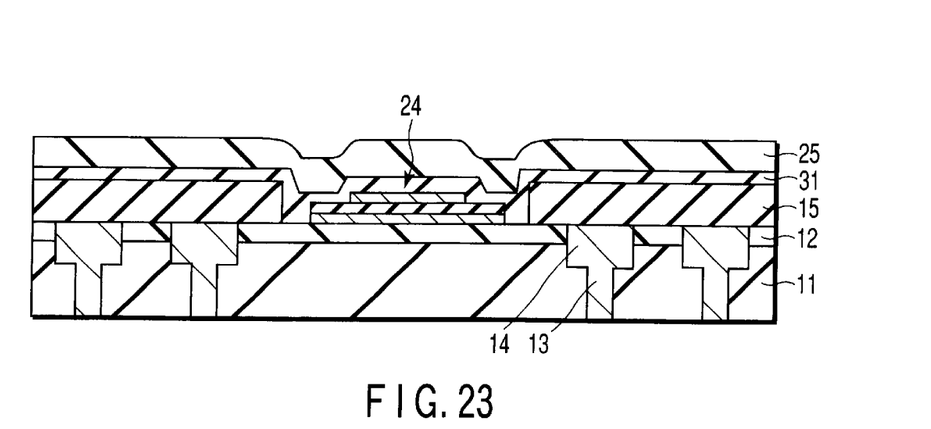
FIGS. 23, 24 and 25 are sectional views illustrating the steps of a process for manufacturing another semiconductor device according to the second embodiment of the invention.
Figure 24:
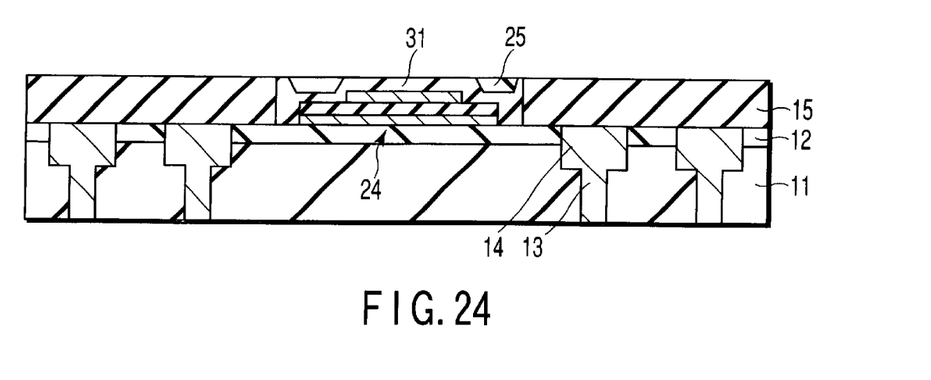
Figure 25:
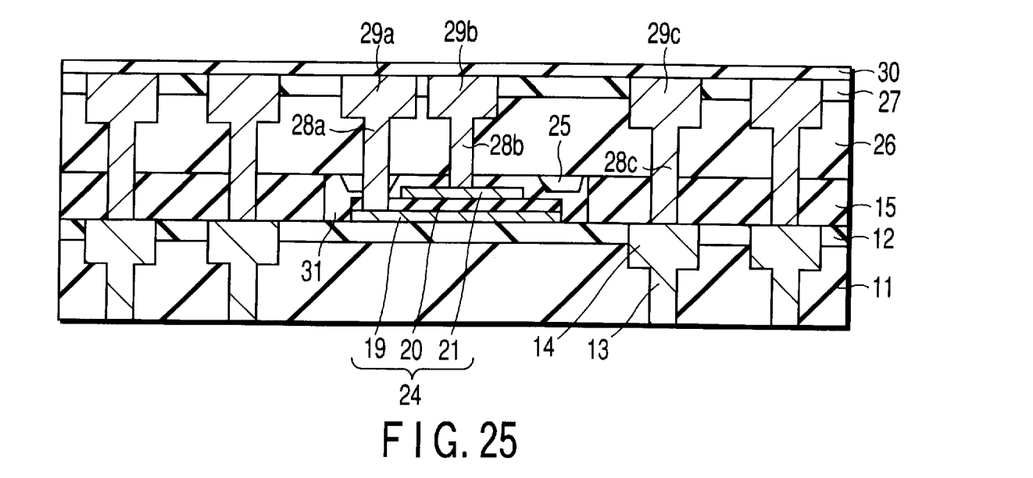

In the second embodiment, another Cu-diffusion-preventing film may be formed on the capacitor 24 to protect it. In this case, at first, the capacitor 24 is formed as shown in FIG. 18. Subsequently, a Cu-diffusion-preventing film 31 is formed on the capacitor 24 and Cu-diffusion-preventing film 15, and the first interlayer film 25 is formed on the Cu-diffusion-preventing film 31, as is shown in FIG. 23. Then, the first interlayer film 25 is flattened by CMP until the surface of the Cu-diffusion-preventing film 15 is exposed, as is shown in FIG. 24. After that, the structure as shown in FIG. 25 is formed by process steps similar to those of the second embodiment. In this structure, the Cu-diffusion-preventing film 31 on the capacitor 24 prevents Cu from diffusing from the second wires 29*a*, 29*b* and 29*c* and via holes 28*a*, 28*b* and 28*c* into the dielectric film 20 of the capacitor 24 and contaminating it.

Figure 26:
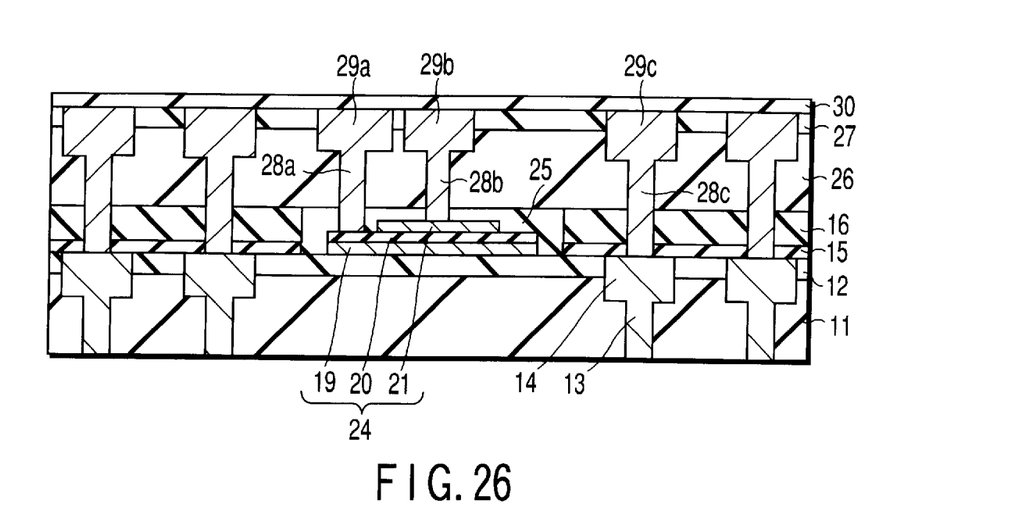
FIGS. 26 and 27 are sectional views illustrating another semiconductor device according to the first and second embodiment of the invention.

As shown in FIG. 26, the Cu-diffusion-preventing film 15 as a high dielectric film and the insulating film 16 as a low dielectric film are provided, and the opening 18 may be formed in these films.

Figure 27:
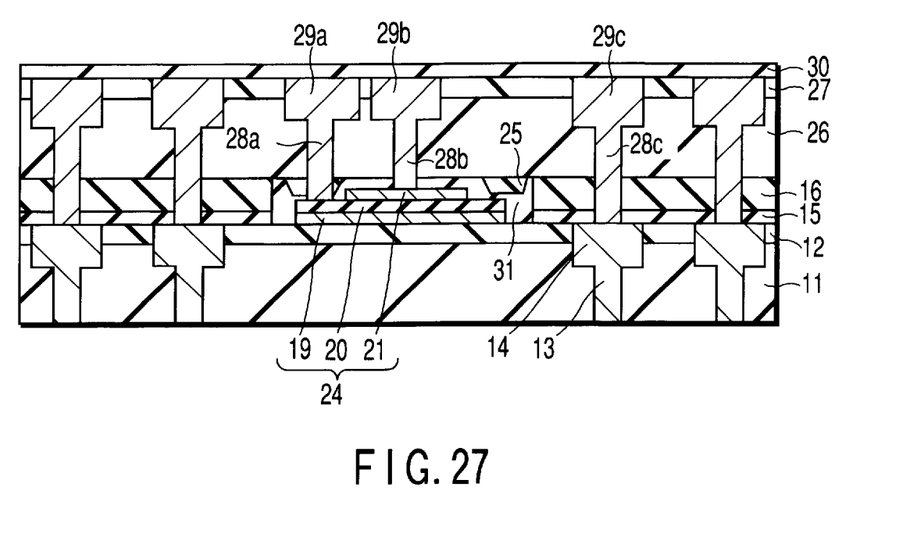

Also, as shown in FIG. 27, the Cu-diffusion-preventing film 31 may be formed on the capacitor 24 to protect it.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first insulating film comprising an opening;
   a first layer being formed under the first insulating film and having an exposed surface which is partially exposed at the opening;
   a capacitor formed at a selected position and only on the exposed surface in the opening;
   a second insulating film formed at least in the opening; and
   a third insulating film formed on the second insulating film.

2. The semiconductor device according to claim 1, further comprising a diffusion preventing film formed under the first insulating film and the capacitor.

3. The semiconductor device according to claim 1, further comprising a diffusion preventing film formed between the capacitor and the second insulating film.

4. The semiconductor device according to claim 1, further comprising a first diffusion preventing film formed under the first insulating film and the capacitor, and a second diffusion preventing film formed between the capacitor and the second insulating film.

5. The semiconductor device according to claim 1, wherein the first insulating film is one of a low dielectric film, a diffusion preventing film and a laminated film formed of the low dielectric film and the diffusion preventing film.

6. The semiconductor device according to claim 1, wherein the third insulating film is a low dielectric film, and the second insulating film comprises a relative dielectric constant higher than the third insulating film.

7. The semiconductor device according to claim 1, wherein the second insulating film is a coated organic insulating film.

8. The semiconductor device according to claim 1, wherein the capacitor is thinner than the first insulating film.

9. The semiconductor device according to claim 1, wherein the second insulating film is formed only in the opening.

10. The semiconductor device according to claim 1, wherein the first insulating film surrounds the capacitor.

11. A semiconductor device comprising:
    a first insulating film comprising an opening;
    a capacitor formed at a selected position in the opening;
    a second insulating film formed at least in the opening;
    a third insulating film formed on the second insulating film; and
    a diffusion preventing film formed under the first insulating film and the capacitor.

12. A semiconductor device comprising:
    a first insulating film comprising an opening;
    a capacitor formed at a selected position in the opening;
    a second insulating film formed at least in the opening;
    a third insulating film formed on the second insulating film;
    a first diffusion preventing film formed under the first insulating film and the capacitor; and
    a second diffusion preventing film formed between the capacitor and the second insulating film.

13. A semiconductor device comprising:
    a first insulating film comprising an opening;
    a capacitor formed at a selected position in the opening;
    a second insulating film formed at least in the opening; and
    a third insulating film formed on the second insulating film,
    wherein the third insulating film is a low dielectric film and the second insulating film comprises a relative dielectric constant higher than the third insulating film.

* * * * *